United States Patent [19]
Kashiyama

[11] Patent Number: 5,689,191
[45] Date of Patent: Nov. 18, 1997

[54] TERMINAL-IN-CONNECTOR CHECKING DEVICE

[75] Inventor: Motohisa Kashiyama, Shizuoka, Japan

[73] Assignee: Yazaki Corporation, Tokyo, Japan

[21] Appl. No.: 630,760

[22] Filed: Apr. 10, 1996

[30] Foreign Application Priority Data

Apr. 13, 1995 [JP] Japan .................................. 7-088137

[51] Int. Cl.⁶ .................................................. H01H 32/04
[52] U.S. Cl. ............................................. 324/538; 439/489
[58] Field of Search ............................... 324/538, 761, 324/754, 72.5; 29/593, 754; 439/188, 310, 488, 489

[56] References Cited

U.S. PATENT DOCUMENTS

| | | |
|---|---|---|
| 4,658,212 | 4/1987 | Ozawa et al. . |
| 5,335,413 | 8/1994 | Yamamoto et al. . |
| 5,512,833 | 4/1996 | Fukuda ........................... 324/538 |
| 5,586,900 | 12/1996 | Yagi ................................ 324/538 |

FOREIGN PATENT DOCUMENTS 4-40669   7/1992   Japan .

*Primary Examiner*—Christine K. Oda
*Attorney, Agent, or Firm*—Armstrong, Westerman, Hattori, McLeland & Naughton

[57] ABSTRACT

A terminal-in-connector checking device consists of a mount (51), a connector holder (54) fixed on the mount for holding a connector in position, a continuity checking member (53) for terminals in the connector, provided on one side of the connector holder and movable to and from the connector holder, a terminal pressing member (1) provided on the side of the connector holder opposite the first-mentioned side, movable to and from the connector holder and including a pressing portion (2) for advancing into the connector and moving a terminal therein to fully-inserted position when the terminal pressing member (1) is moved to the connector holder, and an operating member for moving the checking member and the terminal pressing member to and from the connector holder. A terminal, if in incompletely-inserted position, is automatically moved to fully-inserted position to be checked for continuity.

5 Claims, 5 Drawing Sheets

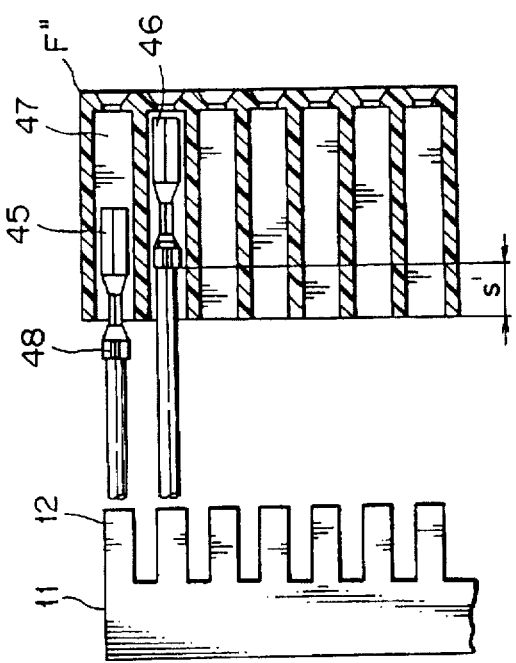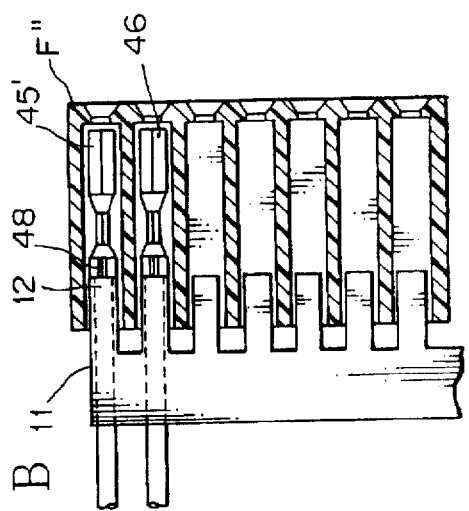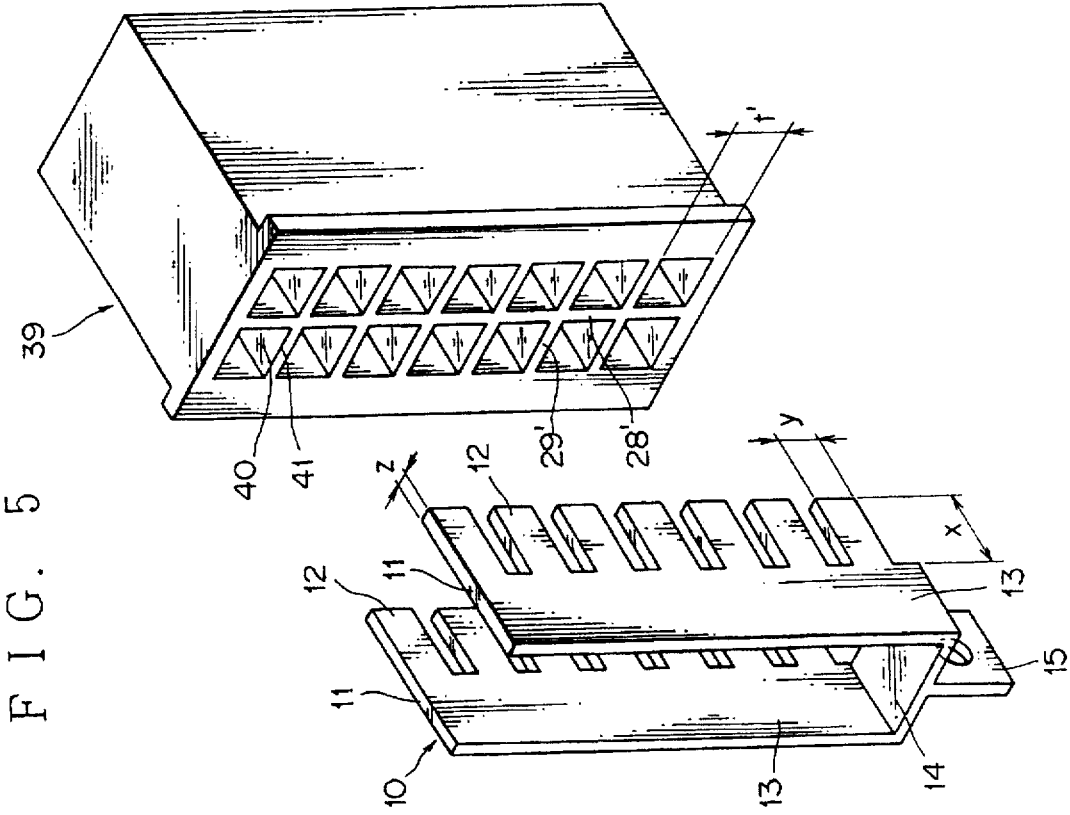

TERMINAL-IN-CONNECTOR CHECKING DEVICE

BACKGROUND OF THE INVENTION

1. Field of the Invention

This invention relates to a terminal-in-connector checking device for making a continuity check for terminals inserted into a connector.

2. Description of the Related Art

FIG. 7 shows a conventional terminal-in-connector checking device disclosed in Japanese Patent Publication Specification No. Hei 4-40669.

This checking device R comprises a mount frame 51 U-shaped in cross section, a continuity checking member 53 at an intermediate position in the mount frame 51, which includes check pins 52, a connector holder 54 rigidly fixed forwardly of the continuity checking member 53, and an operating member 55 rotatably secured on the mount frame 51 at a position rearwardly of the checking member 53.

The continuity checking member 53 comprises at the side towards the connector holder 54 a fitting cavity 56 for a connector F, and the check pins 52 projecting forwardly in the recess 56.

The operating member 55 comprises a support plate 58 with an operating lever 57 at one end, which is pivotally secured to the mount frame 51, an actuating shaft 61 rigidly fixed through a guide 60 to the rear end of the checking portion 53, and a pair of links 59, 59 pivotally connected at respective ends to the support plate 58 and the actuating shaft 61. Due to the above, the rotary motion of the operating lever 57 is transformed into the front and back motion of the continuity checking portion 53.

The connector holder 54 comprises a front plate 82 with an elongated recess 69 formed at the center, a pair of positioning frames 83, 83 extended rearwardly from lateral ends of the front plate 82 to define a connector mounting portion 64 therebetween which is opened upwardly and rearwardly for receiving the connector F therein, and an engagement groove 66 provided on one of the positioning frames 63 adjacent the front plate 82 for engagement of an engagement portion 65 of the connector F therein.

When fitted in the connector mounting portion 64, both lateral walls 68, 68 of the connector housing F are snugly surrounded by the positioning frames 63, 63, with the front surface of the connector F abutting against the front plate 62 and wires 67 from the connector F loosely passed through the recess 69 of the front plate 62, so that the connector F is prevented from slipping off forwardly. The structures of the connector and terminals therein, for example, the structure in which a terminal in an incompletely-inserted position is put into fully-inserted position by engagement with a double locking retainer (not shown), are known techniques, and their detailed description will be omitted.

The operation of the terminal-in-connector checking device R will now be described.

The connector F to be checked is mounted from above into the connector mounting portion 64, followed by forwardly rotating the operating lever 57 to advance the continuity checking member 53 until a distal portion of the connector F has fitted into the fitting cavity 56 of the checking member 53. If in proper position in the connector F, a terminal 71 comes into contact with a check pin 52, so that a connection is made via a not-shown circuit between a wire 70 attached to the check pin 52 and a wire 67 extending from the terminal 71 to indicate "acceptable" as the check result.

If not properly inserted into the connector F, a terminal 72 (the one not in proper position) does not contact the check pin 52, so that "not acceptable" is indicated as the check result. In this case, since the terminal 72 is in halfway-inserted position in the connector F, after completion of the checking, the connector is removed from the mounting portion 64 and examined to see which one of the terminals in the connector F is inserted halfway, followed by insertion of the terminal into proper position in the connector and re-checking for continuity. There has been a problem, however, that with a multi way connector, it requires much time to complete the series of operations, i.e., the discovery and insertion of a half-way-inserted terminal into fully-inserted position and rechecking of the connector.

SUMMARY OF THE INVENTION

This invention has been accomplished to overcome the above drawback and an object of this invention is to provide a terminal-in-connector checking device which does not cause a loss of time in the series of operations of moving a terminal from a halfway-inserted position to a fully-inserted position and rechecking for continuity.

In order to attain the object, a terminal-in-connector checking device of this invention comprises: a mount, a connector holder rigidly fixed on the mount, the connector holder being opened upwardly for receipt therein of a connector as well as forwardly and rearwardly, a continuity checking member for a terminal in the connector, provided on a first side of the connector holder and movable on the mount to and from the connector holder, a terminal pressing member provided on a second side of the connector holder opposite the first side, movable on the mount to and from the connector holder, and including a pressing portion for advancing into the connector and moving a terminal from an incompletely-inserted position to a fully-inserted position when the terminal pressing member is moved to the connector holder, and an operating member on one of the first and second sides of the connector holder, with the checking member or the terminal pressing member between the connector holder and the operating member, the operating member including an operating lever coupled via a link to the checking member and to the terminal pressing member and pivotally supported on the mount for moving the checking member and the terminal pressing member to and from the connector holder.

The terminal pressing member is located on one side of the connector holder and pushed or pulled depending upon the position of the operating lever via the link to the connector holder on rotation of the operating lever, so that the pressing portion of the terminal pressing member enters the interior of the housing of the connector and abuts against, e.g. the proximal end of a stabilizer of a halfway-inserted terminal to push the terminal further into the connector housing. A halfway-inserted terminal is thus moved into fully-inserted position. The above and other objects, features and advantages of this invention will become apparent from the following description and the appended claims, taken in conjunction with the accompanying drawings.

BRIEF DESCRIPTION OF THE DRAWINGS

FIG. 5 is a perspective view of a connector housing and a terminal pressing member according to a second embodiment of this invention;

FIGS. 6A and 6B are longitudinal sectional views showing a pressing portion of the terminal pressing member in FIG. 5 respectively before and after insertion into the connector housing.

DESCRIPTION OF THE PREFERRED EMBODIMENT

Figure 1:
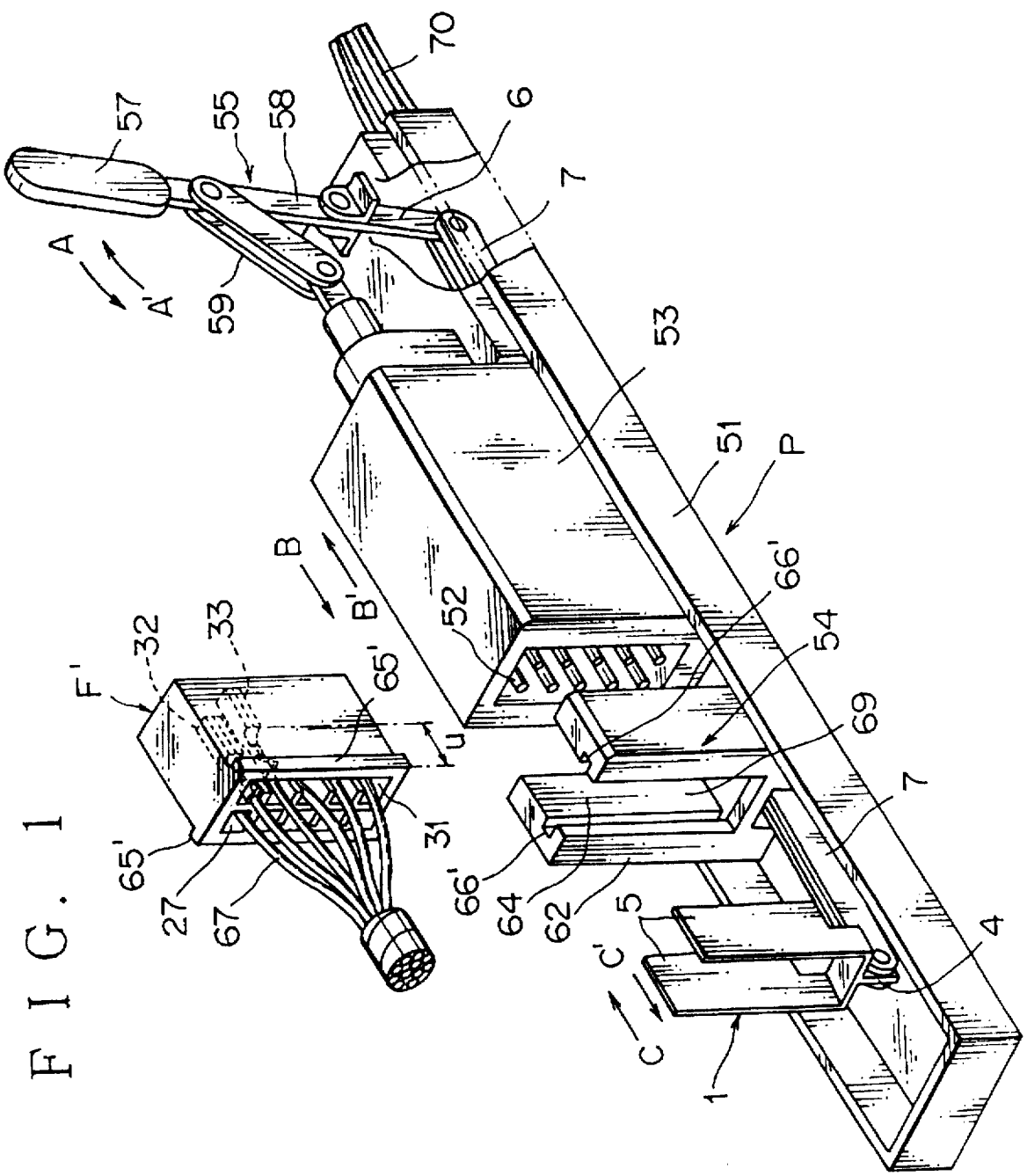
FIG. 1 is a perspective view of a terminal-in-connector checking device according to one embodiment of this invention.

Referring to FIG. 1, a terminal-in-connector checking device P according to this invention comprises a connector holder 54 of conventional structure, a terminal pressing member 1 for the terminals 32, 33 in a connector F', which is disposed forwardly of the connector holder 54, and an operating member 55 disposed on a rear side of the connector holder 54 for pulley the pressing member 1 and pushing a checking member 53 in opposite directions between the connector holder 54 and the operating member 55 to and from the connector holder 54. Since the checking device P is of conventional structure except for the terminal pressing member 1, its detailed description will be omitted, and like reference characters are used to denote like parts or elements.

Figure 3:
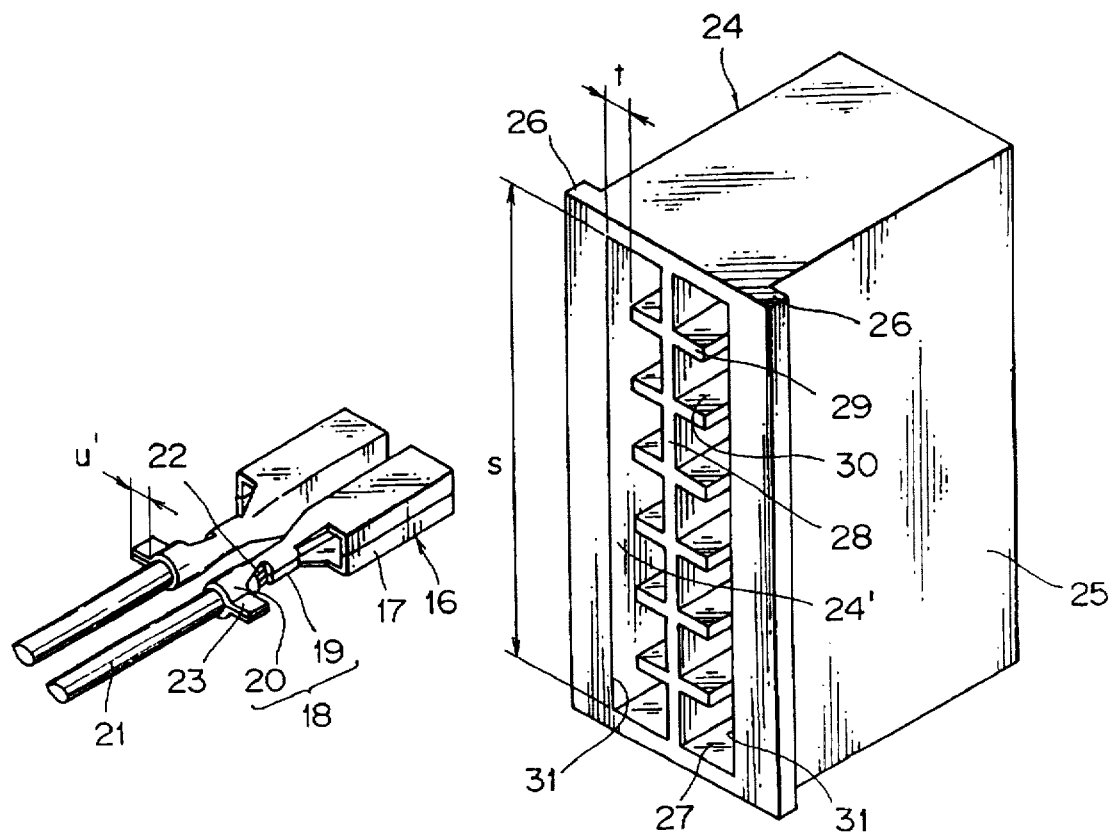
FIG. 3 is a perspective view of a connector housing and terminals used in the checking device in FIG. 1.

Referring to FIG. 3, a terminal 16, which is of the same structure as the terminals 32 and 33, is provided at one side with an electric contact portion 17 and at the other side with a wire holding portion 18. The wire holding portion 18 has a conductor holding portion 19 crimped on and electrically connected with the conductor 22 of a wire 21 and an insulator holding portion 20 crimped on the insulator of the wire 21 to form a laterally protected stabilizer 23 (Japanese Utility Model Publication No. Sho 63-28865).

As shown in FIG. 3, a connector housing 24 has lateral walls 25 each with an engagement flange 26 and is opened forwardly and rearwardly. The engagement flanges 26, 26 are for engagement in corresponding grooves 66', 66' in the connector holder 54 (FIG. 1). As is viewed through an opening 27, a partition wall 28 extends longitudinally of the connector housing 24 to laterally divide the interior of the connector housing 24 into two. The partition wall 28 is at each side formed with six uniformly spaced shelves, which are vertical to the partition wall 28, to provide a total of fourteen (14) terminal-accommodating chambers 30. Each shelf 29 is at its outer side cut away by a length corresponding to the length of the stabilizer 23 of the terminal 16 to provide symmetrical elongated spaces 31 on opposite sides of the partition wall 28. Other portions are of conventional structure and their detailed description will be omitted.

Figure 2:
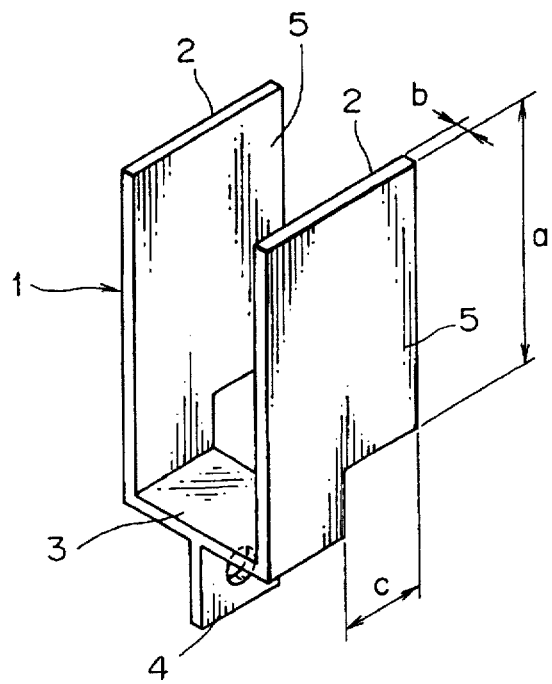
FIG. 2 is a perspective view of a terminal pressing member used in the checking device in FIG. 1.

Referring to FIG. 2, the terminal pressing member 1 is substantially U-shaped in cross section and comprises a pair of pressing portions 2, 2 for pushing terminals 32, 33 (FIG. 1) into the connector housing F', a holding plate 3 between the paired pressing portions 2, 2 for supporting them and suppressing their play, and a fixing plate 4 extended vertically downwardly from the holding plate 3. Each pressing portion 2 comprises a pressing plate 5 having an L-shape upside down when viewed sideways. The pressing plate 5 has the following dimensions:

Height a: nearly equal to the height s (FIG. 3) of an inner wall of the connector housing Thickness b: nearly equal to the length t (FIG. 3) of a cut-away portion of each shelf Length c: nearly equal to the length u (FIG. 4A) from an opening of the terminal accommodating chamber to the proximal end of a stabilizer of the terminal in fully-inserted position Reverting to FIG. 1, an operating member 55 of conventional structure further has, according to this invention, an extended plate 6 longitudinally extended from the support plate 58 at the side remote from the operating lever 57, and a link 7 is at one end pivotally connected to the extended plate 6 and at the other end rigidly coupled to the fixing plate 4 of the terminal pressing member 1 such that no vertical or lateral play of the pressing plate 5 will be caused.

The rotary motion of the operating member 55 is transformed through the links 59, 7 into longitudinal movements effective to push the continuity checking member 53 and to pull the terminal pressing member 1 in opposite directions. With the terminal-in-connector checking device P thus constructed, an incompletely-inserted or halfway inserted terminal 32 in the connector F' is put into a fully-inserted position by the terminal pressing member 1, while the terminals 32, 33 in the connector F' are being checked for continuity by the checking member 53.

The above will now be more specifically described.

Referring to FIG. 1, the connector F', which possibly contains a halfway-inserted terminal 32, is first mounted in the connector mounting portion 64 by sliding the engagement flange 65' of the connector F' along engagement grooves 66' in the connector mounting portion 64. The wires 67 from the connector F' are passed through the recess 69 in the front plate 62 and between the paired pressing plates 5, 5 of the pressing member 1. If the operating lever 57 is then rotated in the direction of A, the links 59 and 7 respectively move the continuity checking portion 53 forwardly in the direction of B and the terminal pressing member 1 rearwardly in the direction of C.

Figure 4A:
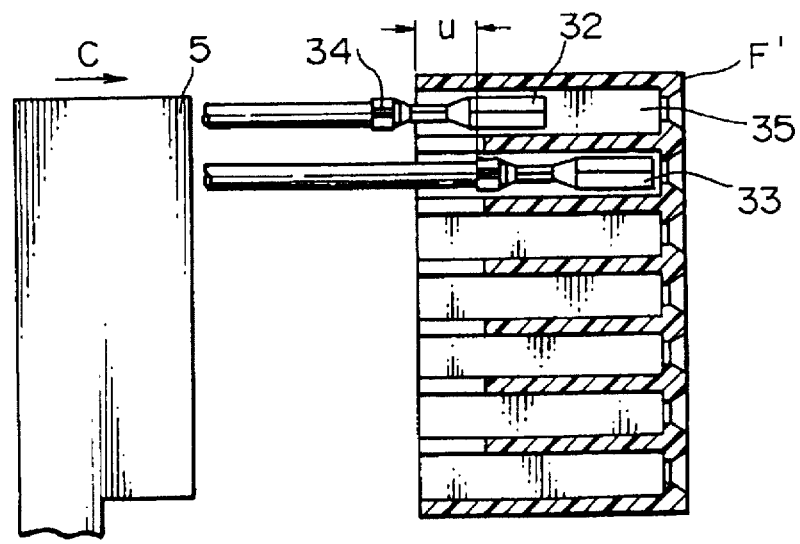
FIGS. 4A, 4B and 4C are longitudinal sectional views showing a pressing portion of the terminal pressing member respectively before, during and after insertion into the connector housing.
Figure 4B:
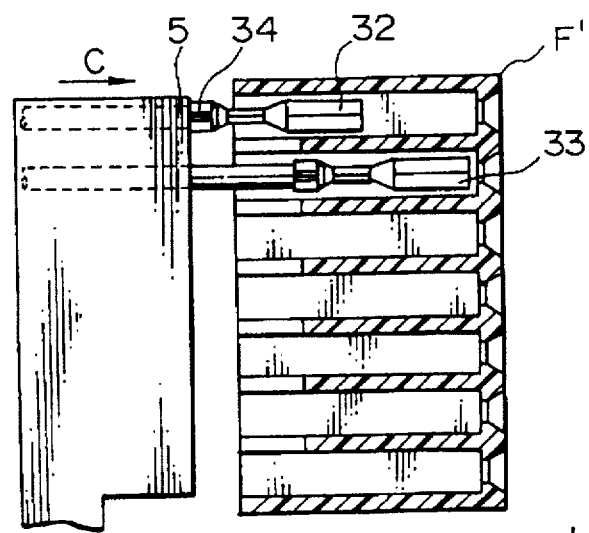
Figure 4C:
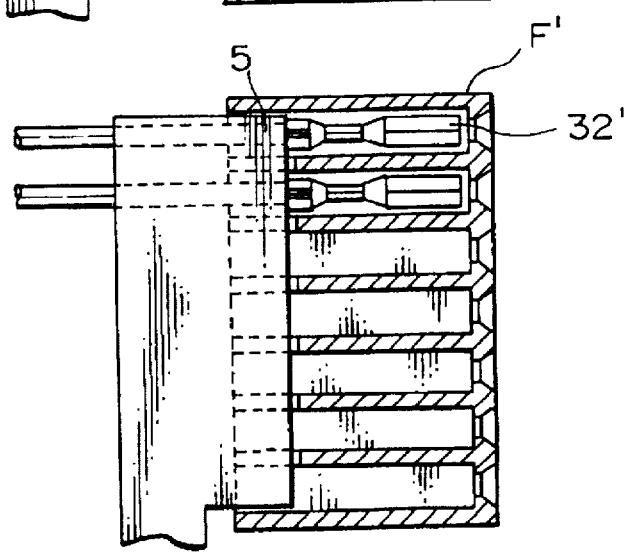
Figure 7:
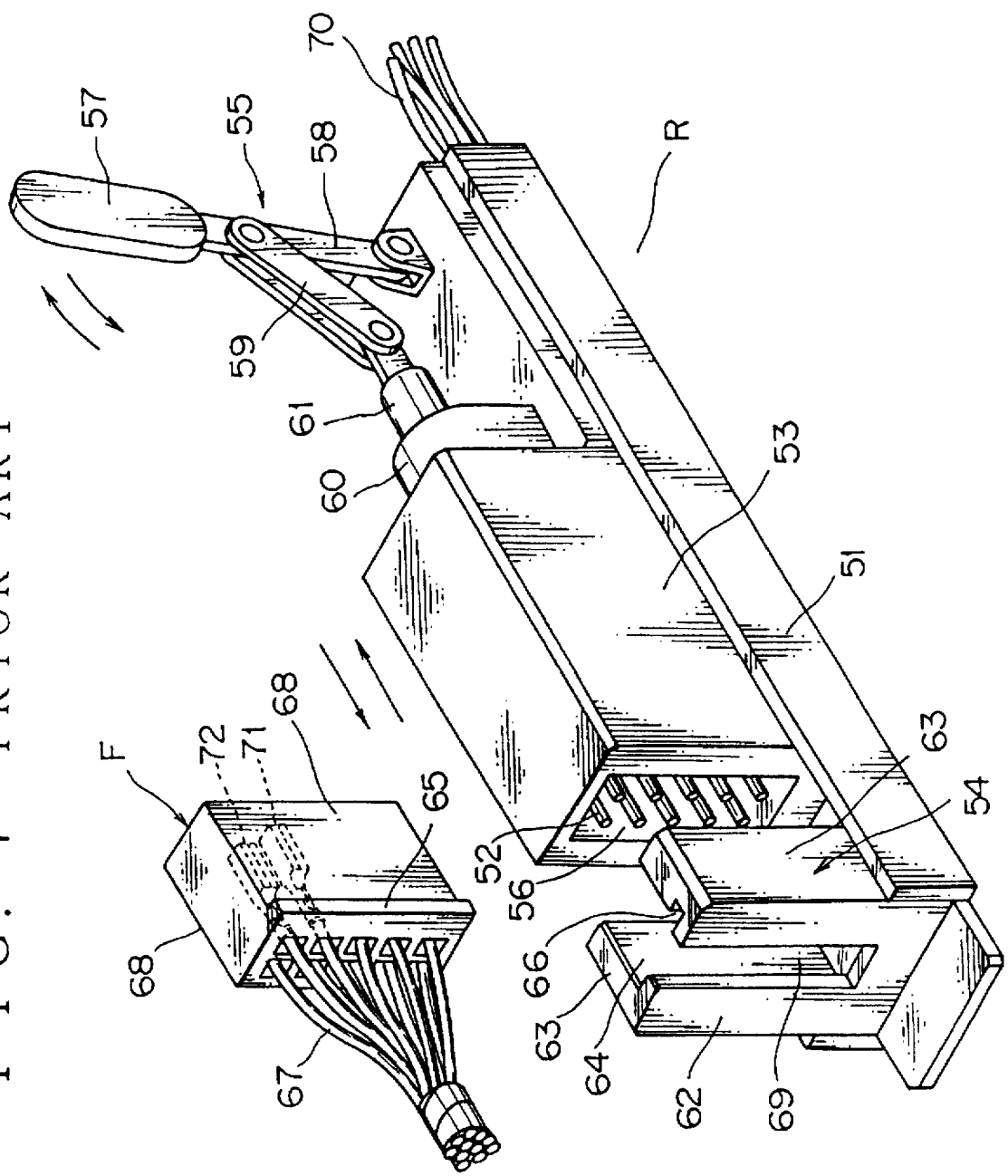
FIG. 7 is a perspective view of a conventional terminal-in-connector checking device.

More specifically, the terminal pressing member 1 moves rearwardly in the direction of C, so that the pressing plates 5 pass through the recess 69 of the connector holder 54 and advance into the elongated spaces 31 in the connector housing F'. On advancing into the elongated spaces 31, the pressing plates 5 abut against the proximal end of the stabilizer 23 of any halfway-inserted terminal 32 to push the same into a fully-inserted position in the related terminal accommodating chamber 35 (FIG. 4A to 4C). In this way, the pressing plates 5 on the left and right sides respectively push any halfway-inserted terminal or terminals to fully-inserted position in the terminal accommodating chambers.

On being put into fully-inserted position 32' (FIG. 4C), the terminal 32 contacts the related one of the check pins 52 of the checking member 53 to be checked for continuity.

After completion of the checking for continuity, the operating lever 57 is rotated in the direction of A' to move the checking member 53 rearwardly in the direction of B' and the terminal pressing member 1 forwardly in the direction of C', so that the checking member 53 and the pressing member 1 are now disengaged from the connector F' in the connector holder 54. Thereafter, the connector F' is pulled out of the connector mounting portion 64 to complete the checking procedure.

With the construction as mentioned above, the terminal 32 originally in halfway-inserted position in the connector F, after being subjected to the checking by the terminal-in-connector checking device P, is always in fully-inserted position 32' and is indicated "acceptable" as the check result (FIGS. 4A to 4C).

On the other hand, terminals 33 in fully-inserted position in the connector F' are not moved by the pressing plates 5 during their movement into the connector F' and contact respective check pins 52 when the checking member 53 moves to the connector holder 54, so that they are checked for continuity with the check pins 52 always with the check result indicating "acceptable".

FIGS. 5 and 6 show a terminal-in-connector checking device according to another embodiment of this invention.

As shown in FIG. 5, a terminal pressing member 10 is substantially U-shaped in cross section as in the first embodiment and comprises a pair of pressing portions 11, 11 for pushing terminals into a connector housing, a holding plate 14 between the paired pressing portions 11, 11 for supporting them and suppressing their play, and a fixing plate 15 extended vertically downwardly from the holding plate 14.

Each pressing portion 11 comprises an elongated base plate 13 and pressing pieces 12, rectangular in cross section, vertically uniformly spaced at a side of the base plate 13 towards a connector housing 39 and of a number corresponding to the number of divided terminal accommodating chambers 40 in a vertical line in the connector housing 39, which pressing pieces advance into respective terminal accommodating chambers 40 to push terminals, if in incompletely-inserted position, farther into the related accommodating chambers 40. The pressing pieces 12 are each perpendicular to the elongated base plate 13.

The pressing pieces 12 may be of any form, e.g. triangular or circular in cross section and are not limited to rectangular, inasmuch as they can advance into respective terminal accommodating chambers 40 and abut against the stabilizers of terminals in incompletely-inserted position to push the same into fully-inserted position. The terminal pressing member 10 can be adapted for a variety of connector housings by suitably arranging the base plate 13 and pressing pieces 12 in accordance with their terminal accommodating chambers.

The pressing pieces 12 in this embodiment have the following specific dimensions:

Length x: nearly equal to the length s' (FIG. 6A) from an opening of the terminal accommodating chamber to the proximal end of a stabilizer of the terminal in fully-inserted position (the same length as u as in the first embodiment);

Height y: nearly equal to the height t' (FIG. 5) of the opening of a terminal accommodating chamber;

Thickness z: nearly equal to the length u' (FIG. 3) of a stabilizer.

Each shelf 29' at opposite sides of the partition wall 28' in the opening 41 of the connector housing 39, unlike the first embodiment, is not at its outer side provided with a cut-away portion and is extended to a respective inner wall of the connector housing 39 so as to provide a total of fourteen (14) isolated terminal accommodating chambers 40.

The operation when moving a terminal from halfway-inserted position to fully-inserted position in the connector housing 39 will now be described, taking up only those points different from the first embodiment.

On rotation of the operating lever 57, the terminal pressing member 10 is moved rearwardly to bring its pressing pieces 12 through the recess 69 of the connector holder 54 (FIG. 1) into respective terminal accommodating chambers 47 of the connector F" (FIGS. 6A and 6B). In this instance, each pressing piece 12 abuts against the stabilizer of the terminal 45 in the related terminal accommodating chamber 47, if the terminal is in incompletely-inserted position, to push the same into fully-inserted position 45'. The terminal 46 fully inserted into the accommodating chamber from the beginning is not influenced by the pressing piece 12 (FIG. 6B).

With the construction as mentioned above, since any halfway-inserted terminal in the connector is automatically pushed by a related pressing piece into fully-inserted position during the continuity check for the terminals in the connector, it is unnecessary that the terminals be in fully-inserted position in the connector prior to the continuity check. In other words, it is unnecessary to provide a double locking retainer (not shown) in the connector housing for retaining a terminal in position.

While in the above embodiments the checking member 53 and the pressing member 1 are described, as shown in FIG. 1, as moving at a time, respectively, in the directions of B (or B') and C (or C') by rotating the operating member 55 in the direction of A (or A'), it is also possible to arrange the checking member and the pressing member such that they move separately from each other. In other words, the checking member 53 may be arranged to move after completion of movement of the pressing member 1, and vice versa.

Although the connector F', F" is shown to be vertically mounted in the connector mounting portion 64, it may also be arranged that the connector F', F" is laterally or slantingly mounted into the mounting portion 64 to be thereafter checked. Further, the engagement flanges 26, 26 may be provided on the opposite lateral walls 25, 25 of the connector housing 24 at any distance from the front end of the connector housing, though shown to be formed adjacent thereto.

While in the above embodiments the operating member 55 is described as being rotated, it is also possible to arrange that the operating member is moved front and back inasmuch as the connector F', F" in the connector mounting portion 64 is caused to be held between the checking member 53 and the pressing member 1, 10. The checking member 53 and the pressing member 1, 10 may, alternatively, change places with each other whereby the pressing member is located between the connector holder and the operator member such that the pressing member is pushed by the operating member and the checking member pulled thereby. Further, the number of terminal accommodating chambers in the connector is not limited to fourteen (14), and the pressing portions 2, 11 can be variously adapted in accordance with the number of terminal accommodating chambers.

As mentioned above, according to this invention, by rotating the operating lever, the connector in the connector holder is held between the oncoming terminal pressing member and continuity checking member, with the pressing portions of the terminal pressing member advancing into the connector, resulting in a halfway-inserted terminal being pushed into fully-inserted position in the connector during continuity check for the terminals in the connector. Consequently, the continuity check for the terminals in the connector can be done, without being bothered by or irrespective of whether or not terminals are in fully-inserted position in the connector. Further, a double locking retainer, or the like, may be omitted from the terminal accommodating chamber of the connector, resulting in the production cost of the connector being reduced.

What is claimed is:

1. A terminal-in-connector checking device comprising:
   a mount, a connector holder rigidly fixed on said mount, said connector holder being opened upwardly for receipt therein of a connector as well as forwardly and rearwardly, a continuity checking member for a terminal in said connector, provided on a first side of said connector holder and movable on said mount to and from said connector holder, a terminal pressing member provided on a second side of said connector holder opposite said first side, movable on said mount to and from said connector holder, and including a pressing portion for advancing into said connector and moving a terminal from incompletely-inserted position to fully-inserted position when said terminal pressing member is moved to said connector holder, and an operating member on one of said first and second sides of the connector holder, with said checking member or said terminal pressing member between said connector holder and said operating member, said operating member including an operating lever coupled via links to said checking member and to said terminal pressing member and pivotally supported on said mount for moving said checking member and said terminal pressing member to and from said connector holder.

2. The terminal-in-connector checking device according to claim 1, wherein said operating member is provided on said first side with said checking member disposed between said connector holder and said operating member.

3. The terminal-in-connector checking device according to claim 1, wherein said terminal pressing member and said checking member are moved at a time to or from said connector holder by rotation of said operating lever.

4. The terminal-in-connector checking device according to claim 1, wherein said pressing portion of the terminal pressing member comprises a pressing plate for advancement into said connector at aligned cut-away portions in shelves defining terminal accommodating chambers in said connector.

5. The terminal-in-connector checking device according to claim 1, wherein said pressing portion of the terminal pressing member comprises a plurality of pressing pieces arranged in correspondence with aligned isolated terminal accommodating chambers in said connector.

* * * * *